(12) United States Patent
Angst et al.

(10) Patent No.: US 6,342,442 B1
(45) Date of Patent: Jan. 29, 2002

(54) KINETICALLY CONTROLLED SOLDER BONDING

(75) Inventors: David L. Angst, New Tripoli; David Gerald Coult, Oley; John William Osenbach, Kutztown, all of PA (US); Gustav Edward Derkits, Jr., New Providence, NJ (US); Brian Stauffer Auker, Denver, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/197,074

(22) Filed: Nov. 20, 1998

(51) Int. Cl.$^7$ .............................................. H01L 23/48
(52) U.S. Cl. ...................................... 438/612; 438/613
(58) Field of Search ................................ 438/613, 612, 438/632

(56) References Cited

U.S. PATENT DOCUMENTS

| | | |
|---|---|---|
| 3,778,305 A | 12/1973 | Holmes et al. |
| 5,123,067 A | 6/1992 | Avelange et al. |
| 5,874,043 A | 2/1999 | Sarkhel et al. |
| 5,990,560 A | * 11/1999 | Coult et al. .................. 257/772 |

FOREIGN PATENT DOCUMENTS

EP          0 875 331 A      11/1998

\* cited by examiner

*Primary Examiner*—Roy Potter
(74) *Attorney, Agent, or Firm*—Lowenstein Sandler PC

(57) ABSTRACT

An improved method and solder composition for kinetically controlled part bonding. The method involves applying at least a first chemical element layer of an intermetallic compound to a first part and applying at least a second chemical element layer of the intermetallic compound to a second part. The first and second parts are placed together so that the chemical element layers contact each other. The parts are heated from a storage temperature to a bonding temperature which is slightly above a first melting temperature that melts the chemical element layer of one of the first and second parts into a liquid mixture. The composition of liquid mixture varies with time during heating due to the formation of the intermetallic compound therein by progressive incorporation of the other one of the first and second chemical element layers into the mixture. The melting temperature of the liquid mixture increases with time as the composition changes until the melting temperature of the liquid mixture is about equal to the bonding temperature thereby soldifying the liquid mixture into a bond. The parts are then held at a holding temperature which is higher than the storage temperature to maintain diffusion of the other one of the first and second chemical element layers into the bond. This forms a quantity of the intermetallic compound in the bond which is sufficient to raise the melting temperature of the bond to a desired usage temperature that is substantially above the first melting temperature. The intermetallic compound is typically composed of a ternary solder composition.

9 Claims, 3 Drawing Sheets

HEATING

HEATING

KINETICALLY CONTROLLED SOLDER BONDING

FIELD OF THE INVENTION

This invention relates to solder bonding, and in particular, to a method and solder compositions for kinetically controlled solder bonding of parts. The invention particularly applies to the bonding of multiple components to a single substrate such as those used in optoelectronic and electronic hybrid integrated circuits.

BACKGROUND OF THE INVENTION

Optoelectronic and electronic hybrid integrated circuits are key components of modern telecommunication systems. These circuits typically comprise various circuit elements which are precisely aligned and bonded to a single substrate with high strength, electrically and thermally conductive bonds. Some circuit elements such as laser chips must be aligned to submicron tolerances.

Soldering is the method often used for achieving these conductive bonds. Soldering involves placing a metal mixture between the circuit element and the substrate, melting the mixture to allow it to intimately contact the circuit element and the substrate, and resolidifying the mixture to cause it to bond the circuit element to the substrate. Resolidification of the mixture is typically achieved by lowering the temperature of the circuit element, substrate and mixture. This causes the mixture to freeze and adhere to the circuit element and the substrate. In order to maintain the requisite spatial alignments, each circuit element is individually placed, precisely aligned, and heated to solder the element to the substrate.

Unfortunately, the heat applied during soldering of a subsequent circuit element may cause an earlier soldered circuit element to become misaligned or dislodged because the solder remelts. Solder remelting may also occur during subsequent circuit processing which involves heating of the substrate.

Solder remelting may be reduced or substantially eliminated by using a kinetically controlled solder bond. The assignee herein in U.S. patent application Ser. No. 08/955,686 filed on Oct. 22, 1997, by Coult et al. describes a method and compositions for achieving a kinetically controlled solder bond. Coult et al. uses a binary gold-tin (Au—Sn) solder composition for bonding the circuit elements to the substrate, a quenching layer which freezes the solder bonds produced by the binary solder, and a barrier layer that delays the freezing action of the quenching layer for a selected period of time. The quenching layer comprises one of the two metallic elements of the binary solder and the barrier layer comprises a third metallic element, such as platinum (Pt), which remains a minority component of the mixture. Accordingly, an $Au_5Sn$ intermetallic solder bond compound is formed between the circuit elements and the substrate. Because the barrier layer forms only a minority component of the of the final solder bond composition, 5 parts of Au must be used for each part of Sn.

The method and solder compositions of Coult et al. are satisfactory for many applications. However, there are applications that require more efficient use of metallic materials and allow debonding of components from the substrate. Accordingly, there is a need for an improved method and solder compositions for kinetically controlled solder bonding parts which utilize materials more efficiently and permit part debonding.

SUMMARY

An improved method for kinetically controlled part bonding comprises applying at least a first chemical element layer of an intermetallic compound to a first part and applying at least a second chemical element layer of the intermetallic compound to a second part. The first and second parts are placed together so that the chemical element layers contact each other. The parts are heated from a storage temperature to a bonding temperature which is slightly above a first melting temperature that melts the chemical element layer of one of the first and second parts into a liquid mixture. The composition of liquid mixture varies with time during heating due to the formation of the intermetallic compound therein by progressive incorporation of the other one of the first and second chemical layers into the mixture. The melting temperature of the liquid mixture increases with time as the composition changes until the melting temperature of the liquid mixture is about equal to the bonding temperature thereby soldifying the liquid mixture into a bond. The parts are then held at a holding temperature which is higher than the storage temperature to maintain diffusion of the other one of the first and second chemical layers into the bond. This forms a quantity of the intermetallic compound in the bond which is sufficient to raise the melting temperature of the bond to a desired usage temperature that is substantially above the first melting temperature. The intermetallic compound is typically a ternary intermetallic compound.

The method and solder composition is especially useful for sequentially bonding multiple device elements to a single optoelectronic circuit support substrate.

DESCRIPTION OF THE DRAWINGS

The advantages, nature and various additional features of the invention will appear more fully upon consideration of the illustrative embodiments described in detail below, considered together with the accompanying drawings. In the drawings.

It should be understood that the drawings are for purposes of illustrating the concepts of the invention and are not to scale.

DETAILED DESCRIPTION

Figure 1A:
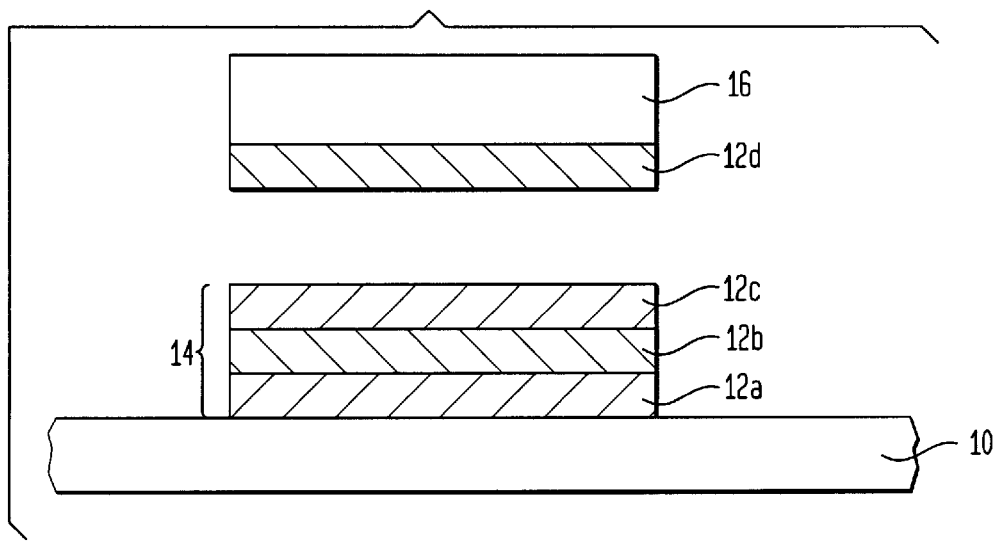
FIGS. 1A–1D are schematic sectional views depicting a method for kinetically controlled solder bonding of parts according to an embodiment of the present invention.

FIGS. 1A–1D depict a method for kinetically controlled solder bonding of parts according to an embodiment of the present invention. In the first step of the method as depicted in FIG. 1A, chemical element layers 12a–12d of an intermetallic solder compound, preferably a ternary intermetallic compound, having a melting temperature $T_{intermetallic}$ are applied to parts 10, 16. The chemical layers 12a–12c applied to the first part 10 define a binary or ternary solder 14 that forms a near eutectic mixture when melted. The solder 14 has a melting temperature $T_{solder}$. In the shown embodiment, the layers 12a–12c define a binary solder where the chemical element layers 12a and 12c are composed of a first metallic element such as gold (Au) and the chemical element layer 12b is composed of a second metallic element such as tin (Sn). The chemical element layer 12d applied on the second part 16 is composed of a third metallic element having a melting temperature that is substantially higher than $T_{solder}$, and is therefore called a quenching layer. The third metallic element can be a transition element such as platinum (Pt), iron (Fe), cobalt (Co), or nickel (Ni). The chemical element layers 12a–12d can be applied to the parts 10, 16 using conventional methods and techniques.

At this stage of the method, the parts 10, 16 can be maintained at a storage temperature $T_{storage}$ until bonding is required. Additionally, the chemical element layers 12a–12d can be reversed on the parts 10, 16 so that the quenching chemical element layer 12d is applied to the first part 10 and the chemical element layers 12a–12c defining the solder 14 are applied to the second part 16. However, if the second part 16 requires pre-bonding processing which involves part heating, the quenching chemical element layer 12d should be applied to the second part 16 to avoid accidental melting of the low melting solder 14.

Figure 1B:
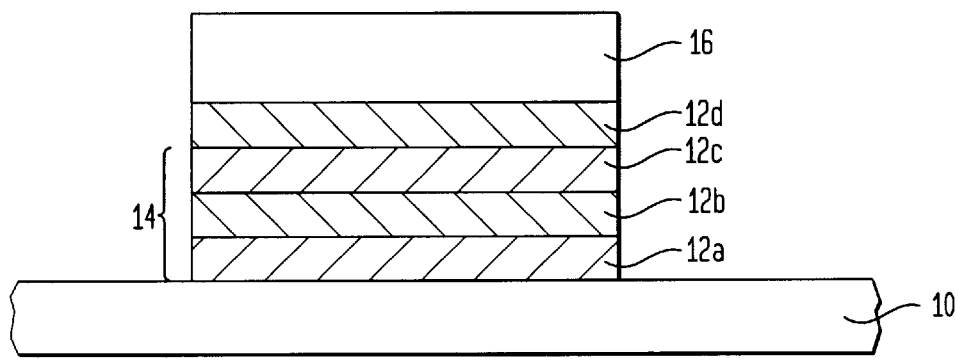

In the next step of the method as depicted in FIG. 1B, the second part 16 is placed on the first part 10 so that the chemical element layer 12d contacts the chemical element layer 12c.

Figure 1C:
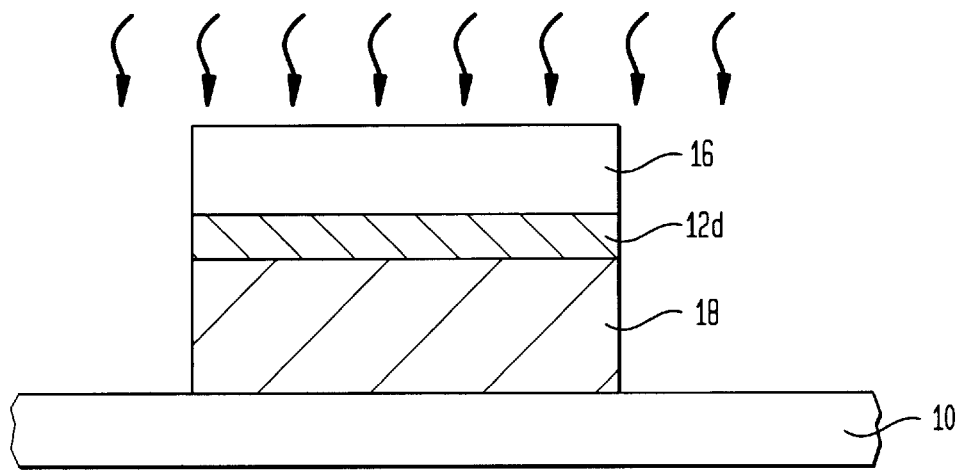

In the third step of the method as depicted in FIG. 1C, the parts 10, 16 are heated to a bonding temperature $T_{bond}$ which melts the chemical element layers 12a–12c of the solder 14 into a liquid mixture 18 having a composition that varies with time during the heating at $T_{bond}$. Typically, $T_{bond}$ is slightly above $T_{solder}$ in order to compensate for small deviations from ideal composition and deviations in temperature between the point of measurement and the point of application.

During heating at $T_{bond}$, $T_{solder}$ of the liquid mixture 18 increases with time due to the formation of the intermetallic compound therein which changes the composition of the liquid mixture 18. This change is caused by the progressive incorporation of the quenching chemical layer 12d. Once the melting temperature of the liquid mixture 18 becomes about equal to $T_{bond}$, the liquid mixture 18 solidifies or freezes into a bond 20 (FIG. 1D).

Figure 1D:
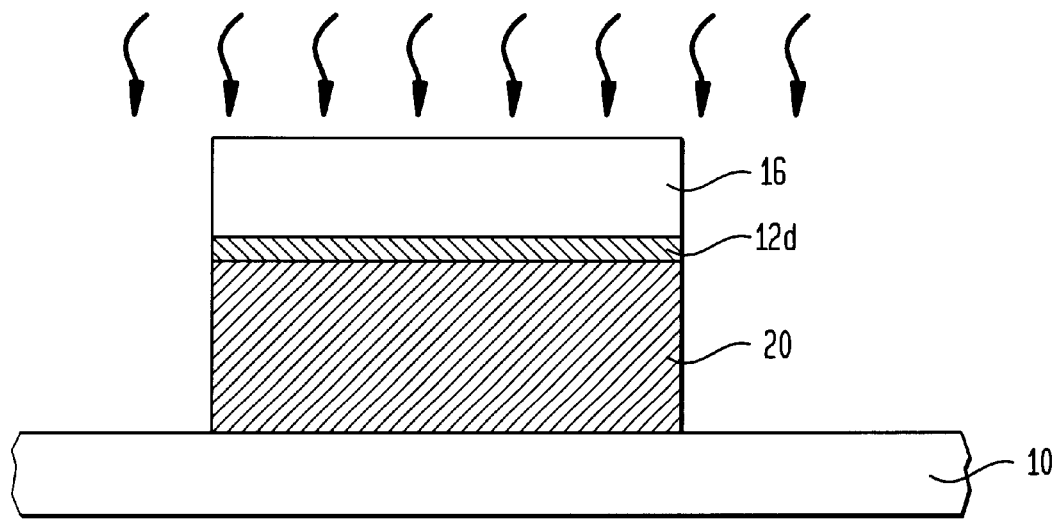

In the final step of the method as depicted in FIG. 1D, the parts 10, 16 remain heated at a temperature $T_{hold}$ to permit continued formation of the intermetallic compound in the bond 20 (the bond composition varies with time during heating) in order to raise the bond's melting temperature to a desired usage temperature $T_{usage}$. The temperature $T_{hold}$ can be equal to temperature $T_{bond}$ or any other temperature sufficiently high to permit continued formation of the intermetallic compound in the bond 20. $T_{usage}$ can be above the bonding temperature $T_{bond}$ and is substantially above (typically about 40° C. above) the melting temperature $T_{solder}$ of the solder 14 formed by the component layers 12a–12c.

Solid state diffusion causes the quenching chemical element layer 12d to diffuse into the bond 20 while the temperature is high, due to the enthalpy of formation of the intermetallic compound in the bond 20. Once a sufficient quantity of intermetallic compound is formed in the bond 20 to raise its melting temperature to $T_{usage}$, the temperature is reduced from $T_{hold}$ to $T_{storage}$. The formation of the intermetallic compound in the bond 20 can also occur prior to the reduction in temperature when the reaction between the chemical element layer 12d and the bond 20 ceases, due to the consumption of the chemical element layer 12d or when the composition of the bond 20 is completely converted to the intermetallic compound.

It is preferred that the intermetallic compound formed in the bond 20 be a ternary intermetallic compound. Such a compound can be obtained by admixing a Pt quenching layer 12d with a Au—Sn binary solder compound 14 to form a $AuPt_2Sn_4$ ternary intermetallic compound in the bond 20. Similarly, Fe admixed with Au—Sn forms a $AuFe_2Sn_4$ ternary intermetallic compound, Co admixed with Au—Sn forms a $AuCo_2Sn_4$ ternary intermetallic compound, and Ni admixed with Au—Sn forms a $AuNi_2Sn_4$ ternary intermetallic compound.

The kinetically controlled solder bonding method of the present invention substantially reduces or eliminates the problem of solder remelting during subsequent processing of the bonded parts 10, 16. The melting temperature of the bond 20 is still low enough, however, to enable debonding of the parts 10, 16 for failure analysis or circuit repair without damaging them.

The kinetically controlled solder bonding method of the present invention has particular application to hybrid optoelectronic circuits, especially circuits having multiple optoelectronic devices bonded to a common base or circuits which are bonded to a package. For example, the second part 16 can be an optoelectronic circuit element such as a laser chip and the first part 10 can be a support structure for the chip such as a planar lightwave circuit defined on a single silicon substrate.

The method of the present invention advantageously provides more efficient use of materials than previous kinetically controlled solder bonding methods. To illustrate this, the chemical element layers of a Au—Sn—Pt ternary solder composition can be used to form an $AuPt_2Sn_4$ intermetallic compound in the bond 20 using the method of the present invention. In previous methods, chemical element layers of a Au—Sn binary solder composition have been used to form bonds having an $Au_5Sn$ intermetallic compounds, with the aid of Pt barrier layer. Because the Pt barrier layer forms only a minority component of the of the final solder bond composition, 5 parts of Au must be used for each part of Sn. However, because the Pt layer in the present invention forms a majority component of the $AuPt_2Sn_4$ intermetallic compound in the bond 20, only 0.25 parts of Au and 0.5 parts of Pt must be used for each part of Sn. Accordingly, the Au and Pt layers used in the ternary intermetallic compound formed in the present invention can be up to ten times thinner than the Au and Pt layers used in forming the previous binary intermetallics.

Figure 2:
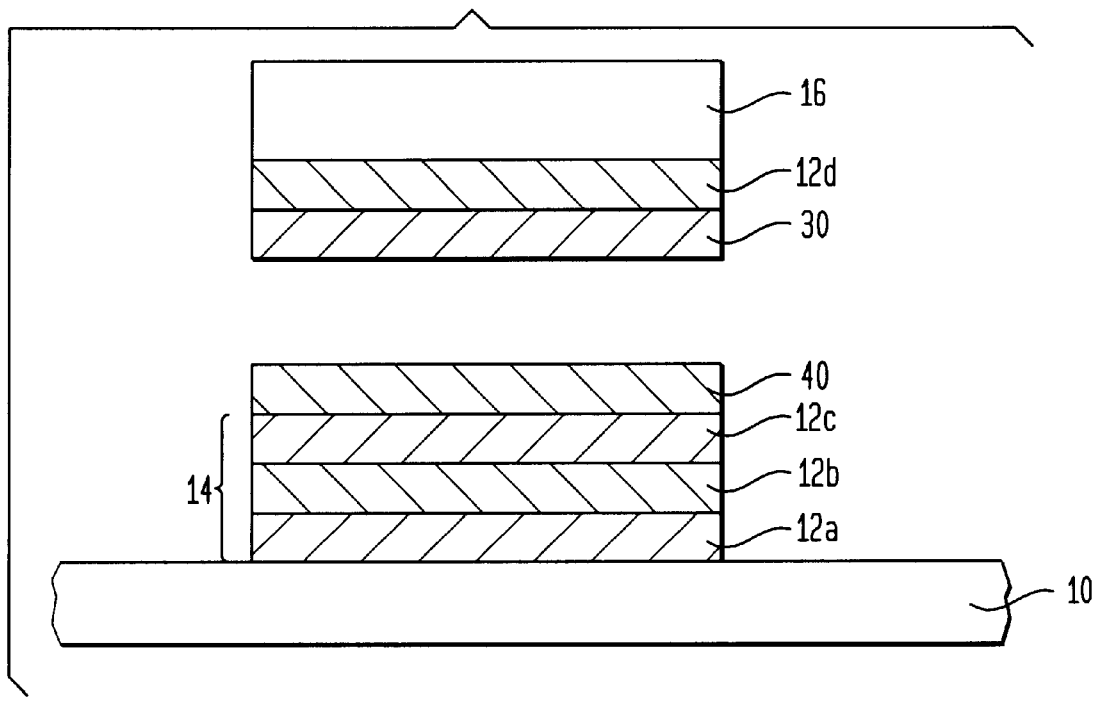
FIG. 2 is a schematic sectional view showing the parts prior to bonding with optional wetting and anti-oxidation layers applied thereto.

FIG. 2 shows the parts 10, 16 with an optional wetting layer 30 applied to the quenching chemical element layer 12d and an optional anti-oxidation layer 40 applied to the solder 14. The wetting layer 30 can be composed of a metallic element such as Au which enhances the reactivity between the quenching chemical element layer 12d and the solder 14 during solder bonding. The anti-oxidation layer 40 can be composed of a metallic element such as Pt which prevents undesired oxidation of the solder 14.

Figure 3:
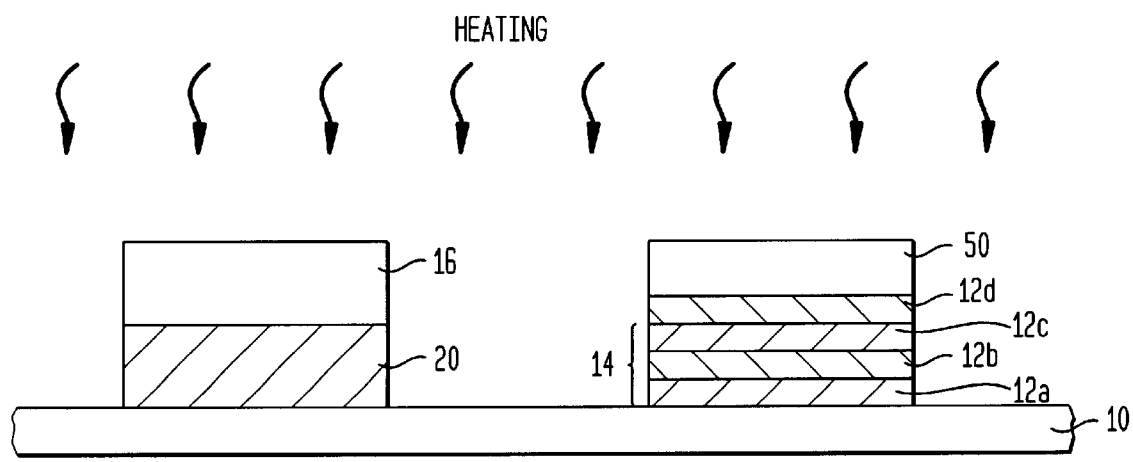
FIG. 3 is a schematic sectional view showing the bonding of a third part to the first part using the bonding method of the present invention.

FIG. 3 shows the soldering of a third part 50 to the first part 10 using the kinetically controlled solder bonding method of the present invention. The third part 50 can be another optoelectronic circuit element such as a second laser chip. Because $T_{usage}$ of the bond 20 between the second part 16 and the first part 10 is substantially higher than $T_{solder}$ of the solder 14, the second part 16 remains aligned with the first part 10 during solder bonding of the third part 50. After soldering, part 10 can be further processed at any temperature below $T_{usage}$ of the solder bonds 20.

Figure 4:
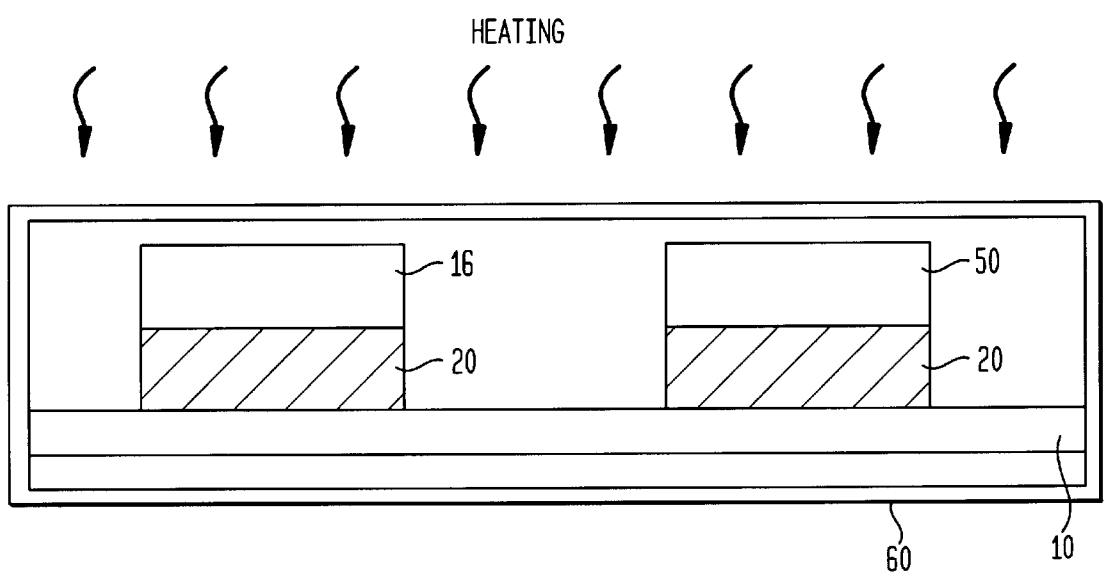
FIG. 4 is a schematic sectional view showing the first part of FIG. 3 solder bonded to a package housing using the method of the present invention.

FIG. 4 depicts further processing of part 10 of FIG. 3. Part 10 is solder bonded to a package housing 60 using the kinetically controlled solder bonding method of the present invention. The solder bonds 20 are unaffected during the soldering of part 10 to the housing 60.

EXAMPLE 1

A multilayered binary solder was applied to two areas of a planar lightwave circuit. Each solder structure included eight (8) alternating layers of Au and Sn with the uppermost layer being Au which produced a binary solder composition of about 65.28% Au and 34.72% Sn that has a melting temperature of about 280° C. Two laser chips were each provided with a Pt solder quenching layer and a Au wetting layer. The Pt solder quenching layer was about 600 nm thick and the Au wetting layer was about 150 nm thick. The first laser chip was bonded to the circuit using a bonding temperature $T_{bond}$ of about 360° C. and the second laser chip was then bonded to the circuit using a bonding temperature $T_{bond}$ of about 320° C. Bonding times were about 8 to 30 seconds in duration. The sub-micron alignment of each laser chip was maintained during soldering.

It should be understood that the above described embodiments are illustrative of only a few of the many possible specific embodiments which can represent applications of the principles of the invention. Numerous and varied other arrangements can be devised by those skilled in the art without departing from the spirit and scope of the invention.

What is claimed is:

1. A method for bonding parts together, the method comprising the steps of:
   (a) applying at least a first chemical element layer of an intermetallic compound to a first part;
   (b) applying at least a second chemical element layer of the intermetallic compound to a second part, wherein one of the at least first and second element layers comprises a binary solder mixture which melts at a first melting temperature;
   (c) placing the second part on the first part so that the chemical element layers contact each other;
   (d) heating the parts from a storage temperature to a bonding temperature which is slightly above the first melting temperature that melts the binary solder mixture into a liquid mixture having a composition that varies with time during heating due to the formation of the intermetallic compound therein by progressive incorporation of the other one of the first and second chemical element layers into the mixture, the first melting temperature of the liquid mixture increasing with time as the composition changes until the melting temperature of the liquid mixture is about equal to the bonding temperature thereby soldifying the liquid mixture into a bond; and
   (e) holding the parts at a holding temperature which is higher than the storage temperature to maintain diffusion of the other one of the first and second chemical element layers into the bond thereby forming a quantity of the intermetallic compound in the bond which raises the melting temperature of the bond to a desired usage temperature that is substantially above the first melting temperature.

2. The method according to claim 1, wherein the binary solder mixture includes a sequence of chemical element layers each comprising a single chemical element of the binary solder mixture, the chemical element layers forming a binary mixture close to the eutectic point of the chemical elements when melted at the first melting temperature.

3. The method according to claim 2, wherein the chemical element layers are gold and tin which form a binary solder mixture close to the eutectic point of gold-tin when melted at the first melting temperature.

4. The method according to claim 1, wherein the other one of the at least first and second chemical element layers comprises a solder quenching layer.

5. The method according to claim 4, wherein the solder quenching layer chemical element is a transition element selected from the group consisting of platinum, iron, cobalt, and nickel.

6. The method according to claim 4, wherein the transition element comprises platinum.

7. The method according to claim 1, wherein one of the first and second parts comprises a common base part and the other one of the first and second parts comprises one of a plurality of component parts, the method further comprising the steps of sequentially bonding remaining ones of the component parts to the common base part using steps (a)–(e), wherein the bonds between the component parts and the common base part remain unmelted during steps (a)–(e).

8. The method according to claim 7, wherein the component parts and the common base part form a hybrid optoelectronic circuit.

9. The method according to claim 8, wherein one of the first and second parts comprises a hybrid optoelectronic circuit and the other one of the first and second parts comprises a package.

\* \* \* \* \*